US010001511B2

(12) United States Patent
Divan et al.

(10) Patent No.: US 10,001,511 B2
(45) Date of Patent: Jun. 19, 2018

(54) SYSTEMS AND METHODS FOR DETERMINING CURRENT FLOW THROUGH A UTILITY ASSET

(75) Inventors: Deepakraj M Divan, Marietta, GA (US); Rohit Moghe, Atlanta, GA (US); Franklin Lambert, Palmetto, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 880 days.

(21) Appl. No.: 13/813,142

(22) PCT Filed: Jul. 27, 2011

(86) PCT No.: PCT/US2011/045492
§ 371 (c)(1),
(2), (4) Date: Feb. 14, 2013

(87) PCT Pub. No.: WO2012/015890
PCT Pub. Date: Feb. 2, 2012

(65) Prior Publication Data
US 2013/0151187 A1    Jun. 13, 2013

Related U.S. Application Data

(60) Provisional application No. 61/368,018, filed on Jul. 27, 2010.

(51) Int. Cl.
*G01R 19/00* (2006.01)
*G01R 27/26* (2006.01)
(Continued)

(52) U.S. Cl.
CPC ....... *G01R 19/0092* (2013.01); *G01R 15/148* (2013.01); *G01R 27/2611* (2013.01); *G06F 11/30* (2013.01)

(58) Field of Classification Search
CPC . G01R 19/0092; G01R 19/2513; G01R 27/02
(Continued)

(56) References Cited

U.S. PATENT DOCUMENTS 3,916,248 A * 10/1975 Nicol .................. G01R 33/022
324/248
4,531,193 A * 7/1985 Yasuhara ............... G01D 5/248
377/19
(Continued)

FOREIGN PATENT DOCUMENTS

CN     103236815 B  *  3/2015
EP        0879419         5/2002

OTHER PUBLICATIONS

International Search Report and Written Opinion dated Dec. 12, 2011 for related PCT Patent Application No. PCT/US2011/045492.

*Primary Examiner* — Roy Y Yi
*Assistant Examiner* — Douglas Kay
(74) *Attorney, Agent, or Firm* — Troutman Sanders LLP; Ryan A. Schneider (57) ABSTRACT

The present invention describes systems and methods for determining current flow through a current-carrying utility asset. An exemplary embodiment can include measuring a first magnetic induction value at a first location near a targeted current-carrying utility asset and a second magnetic induction value at a second location near the targeted asset where the first location is a known distance from the second location; determining a correlation between a spatial angle and an electrical phase angle between the targeted asset and a second asset where the second asset contributes a first and second error component to the first and second magnetic induction values respectively; estimating error values for the first and second error components using the correlation between the spatial angle and the electrical phase angle; and estimating a current flowing through the targeted asset using the first and second magnetic induction values, the known distance, and the error values.

15 Claims, 11 Drawing Sheets

(51) Int. Cl.
*G01F 11/30* (2006.01)
*G01R 15/14* (2006.01)
*G06F 11/30* (2006.01)

(58) Field of Classification Search
USPC .............................................. 702/57, 64, 65
See application file for complete search history.

(56) References Cited

U.S. PATENT DOCUMENTS

| | | | |
|---|---|---|---|
| 4,709,339 A | | 11/1987 | Fernandes |
| 6,040,690 A | * | 3/2000 | Ladds .................... G01R 21/08 324/117 H |
| 6,512,359 B1 | * | 1/2003 | Tamai .................. G01R 15/207 324/117 H |
| 6,727,682 B1 | * | 4/2004 | Tobin .................. G01R 15/148 324/117 H |
| 7,642,768 B1 | | 1/2010 | Kinzel |
| 7,898,240 B2 | * | 3/2011 | Shibahara ............ G01R 15/202 324/117 H |
| 2007/0024293 A1 | * | 2/2007 | Kosaka ................ G01R 31/001 324/754.21 |
| 2007/0205750 A1 | * | 9/2007 | Yakymyshyn ....... G01R 15/207 324/127 |
| 2008/0122642 A1 | | 5/2008 | Radtke et al. |
| 2009/0021249 A1 | * | 1/2009 | Kumar ................. G01R 15/207 324/227 |
| 2010/0097049 A1 | | 4/2010 | Lepine et al. |
| 2010/0148907 A1 | | 6/2010 | Younsi et al. |

\* cited by examiner

Fig. 6 a) I1 and I2 over time.

b) Error between the actual I1 and estimated I1 over time.

Fig. 7 a) I1 and I2 over time.

b) Error between the actual I1 and estimated I1 over time.

Fig. 8 a) I1 and I2 over time.

b) Error between the actual I1 and estimated I1 over time.

SYSTEMS AND METHODS FOR DETERMINING CURRENT FLOW THROUGH A UTILITY ASSET

CROSS REFERENCE TO RELATED APPLICATION

This application claims the benefit of U.S. Provisional Patent Application No. 61/368,018, filed 27 Jul. 2010, the entire contents and substance of which are hereby incorporated by reference as if fully set forth below.

FIELD OF THE INVENTION

The present invention relates generally to utility data services and particularly to systems and methods for determining current flow through a utility asset.

BACKGROUND OF THE INVENTION

The demand for electric power has been rapidly increasing for the last few decades. Lagging investments to improve the power grid have led to a rise in congestion, equipment overloads, and system disturbances. The power grid has been pushed to its technical limits. In addition, the electricity grid is old and has started showing signs of aging. Increasing dependence by industrial and commercial users, and society in general, on electric power has compelled utilities to take measures that ensure high reliability of their power system apparatus.

Information on parameters of the power grid such as the temperature of an asset or the amount of current flowing through an asset is necessary in order to effectively maintain the system. The lack of such information can lead to catastrophic failures and major blackouts. However, the power grid stretches over thousands of miles making it too costly and impractical to monitor the system using conventional methods.

An increasing thrust towards implementing a smart grid and improving the asset monitoring infrastructure inside substations as well as on the transmission and distribution network has led the utilities to start adopting smarter sensing technologies. Advancements in wireless sensor networks are making the prospect of monitoring such a large scale system more feasible. Research in this area has led to the development of low power protocols, meshed topologies, increased distance of transmission, and overall highly reliable networks.

The technology for monitoring conditions on the power grid has not kept pace with the advancement in communication protocols. Nearly all conventional sensors are large, bulky, and expensive. For example, most sensors for monitoring the current through an asset work through magnetic induction and utilize closed-core structures. The closed-core structure requires the sensors to be clamped around the asset. The labor required to clamp these devices is costly. Furthermore, the bulkiness of these sensors and the need for the devices to be physically clamped onto the monitored asset precludes their use in situations where the geometry of the monitored asset does not allow such clamping.

Therefore, it would be advantageous to provide a low-cost, compact solution for monitoring conditions on the power grid that would not be limited by the geometry of the asset or assets being measured.

BRIEF SUMMARY OF THE INVENTION

The present invention describes systems and methods for determining current flow through a current-carrying utility asset. An exemplary embodiment of the present invention provides methods for determining the magnitude of a current flowing through a nearby current-carrying utility asset in the vicinity of other current-carrying utility assets including measuring a first magnetic induction value having a first error component at a first location near a targeted current-carrying utility asset and a second magnetic induction value having a second error component at a second location near the targeted current-carrying utility asset, the first location being a known distance from the second location; determining a correlation between a spatial angle and an electrical phase angle between the targeted current-carrying utility asset and a second current-carrying utility asset, the second current-carrying utility asset contributing the first error component and the second error component; estimating error values for the first error component and the second error component using the correlation between the spatial angle and the electrical phase angle; and estimating a current flowing through the targeted current-carrying utility asset using the first magnetic induction value, the second magnetic induction value, the known distance, and the error values.

In addition, the present invention provides systems for determining the magnitude of a current flowing through a nearby conductor in the vicinity of other current-carrying utility assets including a first open core current sensor for measuring a first magnetic induction value in the first open core current sensor; a second open core current sensor for measuring a second magnetic induction value in the second open core current sensor where the second open core current sensor is located a known distance from the first open core current sensor; a targeted current-carrying utility asset and a second current-carrying utility asset located in the vicinity of the first and second open core current sensors, the targeted current-carrying utility asset located closer to the first and second open core current sensors than the second current-carrying utility asset; and a microcontroller enabled to execute a current calculating module, the current calculating module enabled to estimate a first current flowing through the targeted current carrying utility asset wherein estimating the first current comprises using the first and second magnetic induction values and the known distance.

These and other objects, features and advantages of the present invention will become more apparent upon reading the following specification in conjunction with the accompanying drawing figures.

DETAILED DESCRIPTION

The subject matter of the various embodiments is described with specificity to meet statutory requirements. However, the description itself is not intended to limit the scope of the claimed invention. Rather, it has been contemplated that the claimed invention can be embodied in other ways, to include different steps or elements similar to the ones described in this document, in conjunction with other present or future technologies. Although the term "step" can be used herein to connote different aspects of methods employed, the term should not be interpreted as implying any particular order among or between various steps herein disclosed unless and except when the order of individual steps is explicitly required. The following description is illustrative and non-limiting to any one aspect.

It should also be noted that, as used in the specification and the claims, the singular forms "a," "an" and "the" include plural references unless the context clearly dictates otherwise. For example, reference to a component is intended to also include composition of a plurality of components. References to a composition containing "a" constituent are intended to include other constituents in addition to the one named. Also, in describing preferred embodiments, terminology will be resorted to for the sake of clarity. It is intended that each term contemplates its broadest meaning as understood by those skilled in the art and includes all technical equivalents that operate in a similar manner to accomplish a similar purpose.

Ranges can be expressed herein as from "about" or "approximately" one particular value and/or to "about" or "approximately" another particular value. When such a range is expressed, other exemplary embodiments include from the one particular value and/or to the other particular value. The terms "comprising" or "containing" or "including" mean that at least the named component, element, particle, or method step is present in the system or article or method, but does not exclude the presence of other components, materials, particles, or method steps, even if the other such components, material, particles, and method steps have the same function as what is named.

It is also to be understood that the mention of one or more method steps does not preclude the presence of additional method steps or intervening method steps between those steps expressly identified. Similarly, it is also to be understood that the mention of one or more components in a system or composition does not preclude the presence of additional components than those expressly identified. To facilitate an understanding of the principles and features of the present invention, embodiments are explained hereinafter with reference to implementation in illustrative embodiments.

An exemplary embodiment of the present invention provides a smart current sensing approach that uses an open core structure. An open core structure is one in which the magnetic flux from a magnetic field is not conducted along a closed path. In the presence of a single nearby conductor it is known to measure current with a high degree of accuracy when using an open core structure. In a majority of implementations, however, a power substation for example, there are different types of current-carrying assets in close proximity to one another. This would not affect a conventional closed core sensor. Closed core structures are those that form a closed path around a current-carrying asset through which the magnetic flux is contained. The closed core structure of a conventional current sensor inhibits coupling of any far off magnetic fields that can affect the measurement readings. However, a sensor using an open core structure would be affected by the magnetic fields of the other assets in the vicinity.

Another problem with using the open core structure is that the distance of the core from the conductor affects the measured current value. Thus, a current sensor using an open core structure needs to be calibrated with the distance from the conductor before it can give any accurate measurement results. Since cost is one of the major drivers for such sensors to be mass deployed in a wireless sensor network, such field calibration requirements may effectively increase the cost of such sensors and render them as an unattractive solution. Conventional devices have been unsuccessful in solving the above two problems; therefore, open core structures for current measurement are not often used.

The present invention addresses deficiencies in the prior art of current sensors concerning the cost, calibration requirements, and inability to differentiate between multiple current-carrying utility assets. Significantly, an exemplary embodiment of the present invention provides systems and methods for determining current flow through a conductor. An exemplary embodiment of a device for determining current flow through a conductor provided in accordance with the present invention can self-calibrate and provide accurate current measurements in the presence of multiple current-carrying utility assets, allowing the device to be attached onto a utility asset or mounted in the vicinity of the asset. Additionally, the size and weight of an exemplary embodiment of a device for determining current flow through a conductor provided in accordance with the present invention can be reduced by an order of magnitude when compared with conventional alternatives. Such small dimensions could be adaptable to multiple utility assets bearing several kinds of utility asset geometries.

Figure 1:
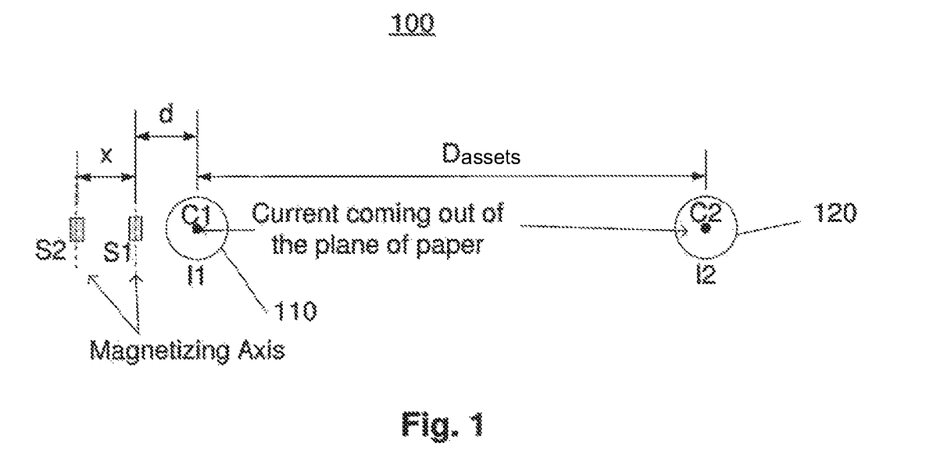
FIG. 1 provides an illustration of a system for determining current flow through a conductor in accordance with an exemplary embodiment of the invention.

FIG. 1 provides an illustration of a system for determining current flow 100 through a conductor in accordance with an exemplary embodiment of the invention. A sensor $S_1$ can be located at a distance, d, from a primary current-carrying utility asset 110. In an exemplary embodiment, the sensor $S_1$ can be made from a wire coil encircling a core made from iron and copper. The current-carrying utility asset 110 can carry an alternating current $I_1$. Current flowing through a current-carrying utility asset creates a magnetic field and an alternating current creates an alternating magnetic field. Through the process of magnetic induction, the intensity of that magnetic field at a given location can be measured. Short circuit current (SCC) is one measure of magnetic induction while open circuit voltage (OCV) is another. Both SCC and OCV are directly proportional to the current flowing through a conductor and inversely proportional to the distance from it as seen in the following equations:

$$I_{SCC} = \frac{\alpha I_{pri}}{d} \quad (1)$$

$$V_{OCV} = \frac{\beta I_{pri}}{d} \quad (2)$$

$$\beta = Z\alpha \quad (3)$$

where $I_{pri}$ is the current flowing through the current-carrying utility asset, $I_{SCC}$ is the SCC measured in $S_1$, $V_{OCV}$ is the OCV measured in $S_1$, Z is $V_{OCV}/I_{SCC}$ and is fixed, $\alpha$ is dependent on the structure and properties of the core, and d is the distance from the current-carrying utility asset 110 to the sensor $S_1$. Because the value of a magnetic induction measurement is an indicator of the intensity of the magnetic field at a given location, if the distance d from a single source $I_1$ to the sensor $S_1$ is known, then, in accordance with an exemplary embodiment of the present invention, the current $I_1$ through 110 can be determined from the intensity of the magnetic field measured by $S_1$. However, if a second current $I_2$ flowing through a second current-carrying utility asset 120 is added, it is not possible to accurately determine the first current $I_1$, because the second current $I_2$ adds an error component to the measurement of the magnetic field. This error component is the unknown effect the magnetic field generated by the second current $I_2$ has on the measured magnetic induction value. However, in accordance with an exemplary embodiment of the present invention, a system 100 with two sensors is provided and the inverse relationship between magnetic field intensity and distance can be used to determine the currents $I_1$ and $I_2$ through the sources 110 and 120.

A second sensor $S_2$ can be located at a known distance x from the first sensor $S_1$. In the exemplary embodiment shown in FIG. 1, the second sensor $S_2$ lays on a common axis with $S_2$, 110, and 120. Using the relationship between distance, the intensity of the magnetic field, and the current flowing through the conductors, the following equations can be derived, $$I_{S1} = \frac{\alpha I_1}{d} + \frac{\alpha I_2}{D_{assets} + d} \tag{4}$$

$$I_{S2} = \frac{\alpha I_1}{d+x} + \frac{\alpha I_2}{D_{assets} + d + x} \tag{5}$$

where $I_{S1}$ is the SCC through the first open core current sensor S1, $I_{S2}$ is the SCC through the second open core current sensor S2, d is the distance from the center of the first open core current sensor S1 to the center of current-carrying utility asset 110 and $D_{assets}$ is the distance from the center of the first current carrying utility asset 110 to the center of the second current-carrying utility asset 120.

Using the assumption that $D_{assets}$ is very large compared to x and d, the following formula can be used for solving $I_1$:

$$I_1 = \frac{\alpha(I_{S1} - I_{S2})d(d+x)}{\alpha d}. \tag{6}$$

Figure 2:
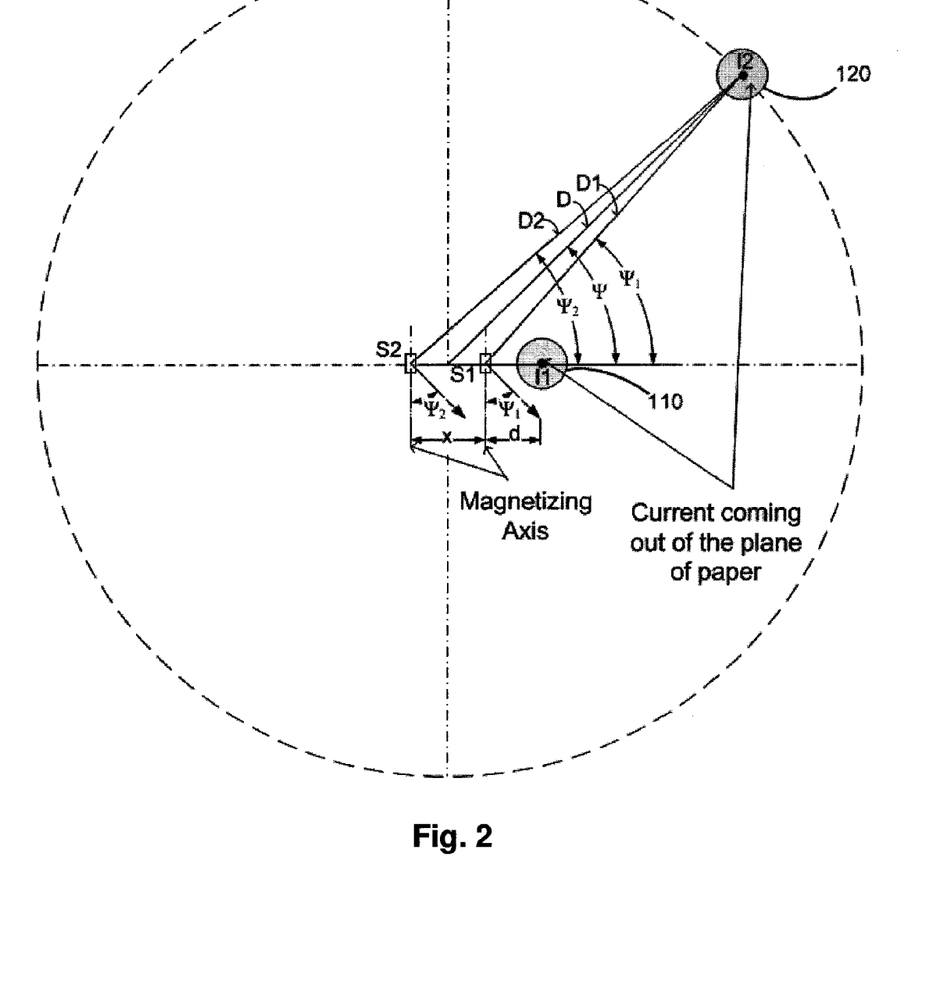
FIG. 2 provides an illustration of a system for determining current flow through a conductor in accordance with an exemplary embodiment of the invention.

FIG. 2 provides another illustration of a system for determining current flow 100 through a conductor in accordance with an exemplary embodiment of the invention. In this embodiment, a more general approach is taken with the possible arrangement of the system components. In an exemplary embodiment of the present invention, it can be assumed that the far conductor 120 is at a distance D from the center of the two sensor cores and can be present anywhere in space. The spatial angle of the far conductor 120 from the center of the two sensor cores is $\psi$. The two sensor cores can be placed in any arrangement with respect to one other, as long as the distance between them is known. For example and not limitation, it is assumed for this description that they are aligned with the near conductor 110. The near conductor 110 strongly couples with the two sensor cores and produces a magnetic field along the magnetic field axis shown in FIG. 2. While the far conductor 120 produces a magnetic field at an angle of $\psi 1$ and $\psi 2$ with respect to the two sensor cores. This magnetic field can be broken down into a sine and a cosine component, where only the cosine component of this magnetic field strongly couples with the two cores. The SCC induced in the two sensor cores will then be given by:

$$\tilde{I}_{S1} = \frac{\alpha \tilde{I}_1}{d} + \frac{\alpha \tilde{I}_2}{D_1} \cos\psi_1 \tag{7}$$

$$\tilde{I}_{S2} = \frac{\alpha \tilde{I}_1}{d+x} + \frac{\alpha \tilde{I}_2}{D_2} \cos\psi_2. \tag{8}$$

Where, $$D_1 = \left[(D\sin\psi)^2 + \left(D\cos\psi - \frac{x}{2}\right)^2\right]^{1/2} = \left[D^2 + \frac{x^2}{4} - Dx\cos\psi\right]^{1/2} \tag{9}$$

$$D_2 = \left[(D\sin\psi)^2 + \left(D\cos\psi + \frac{x}{2}\right)^2\right]^{1/2} = \left[D^2 + \frac{x^2}{4} + Dx\cos\psi\right]^{1/2} \tag{10}$$

$$\cos\psi_1 = \frac{\left(D\cos\psi - \frac{x}{2}\right)}{D_1} \tag{11}$$

$$\cos\psi_2 = \frac{\left(D\cos\psi + \frac{x}{2}\right)}{D_2} \tag{12}$$

$I_1$ and $I_2$ can be considered to have an electrical phase angle difference of $\varphi$ between them. In Equations (7) and (8), there are six unknowns: $I_1$, $I_2$, d, D, $\psi$, and $\varphi$. There are, however, only two equations available to extract these unknowns. Thus, it is impossible to compute a closed form solution for all of these unknowns. If another set of sensed information were available, assuming that the geometry and other external conditions (D, d, $\psi$, and $\varphi$) do not change, it would be possible to have four equations. $I_1$ and $I_2$ might have changed from the previous sensed time. Hence, there are eight unknowns and four equations. If the sensed information were again gathered, this would lead to ten unknowns and six equations. Suppose over a period of time a large amount of sensed information is collected. Then, in general, if there were n equations, then there would be n+4 unknowns. With multiple measurements, it can be possible to gradually estimate the position of the two sensor cores with respect to the nearby and far-off conductor and concurrently find an improved estimate of the current flowing in the nearby conductor, but the system of equations cannot be solved for a closed form solution.

Because the system of equations cannot be solved for a closed form solution; a novel approach has been devised that helps in finding close to approximate solutions of the parameters of interest ($I_1$, d, and D). The SCC of the two sensor cores can be added and subtracted to obtain two indicators namely, $I_d$ and $I_c$.

$$\tilde{I}_d = P\tilde{I}_1 + Q\tilde{I}_2 \tag{13}$$

$$\tilde{I}_c = R\tilde{I}_1 + S\tilde{I}_2 \tag{14}$$

where $I_c$ is the sum of $I_{S1}$ and $I_{S2}$ and $I_d$ is the difference of $I_{S1}$ minus $I_{S2}$. As is understood, P, Q, R, and S can be determined algebraically. For example, taking the sum and difference of equations (7) and (8) results in P, Q, R, and S becoming functions of variables d, $D_1$, $D_2$, $\Psi_1$, $\Psi_2$. Further taking into account equations h results in P, Q, R, and S becoming functions of variables d, D, and $\Psi$.

The ratio of $I_d$ to $I_c$, the Far Field Rejection Ratio (Fr), can act as an indicator that can be thought of as providing a confidence level to the current measurements.

$$Fr = \left|\frac{i_d}{i_c}\right| \quad (15)$$

The general nature of Fr under various conditions (different values of $I_1$ and $I_2$) can help in determining the parameters of interest. There are two unknown parameters that have a pronounced effect on the nature of the Fr curve, namely, φ and ψ.

Figure 3:
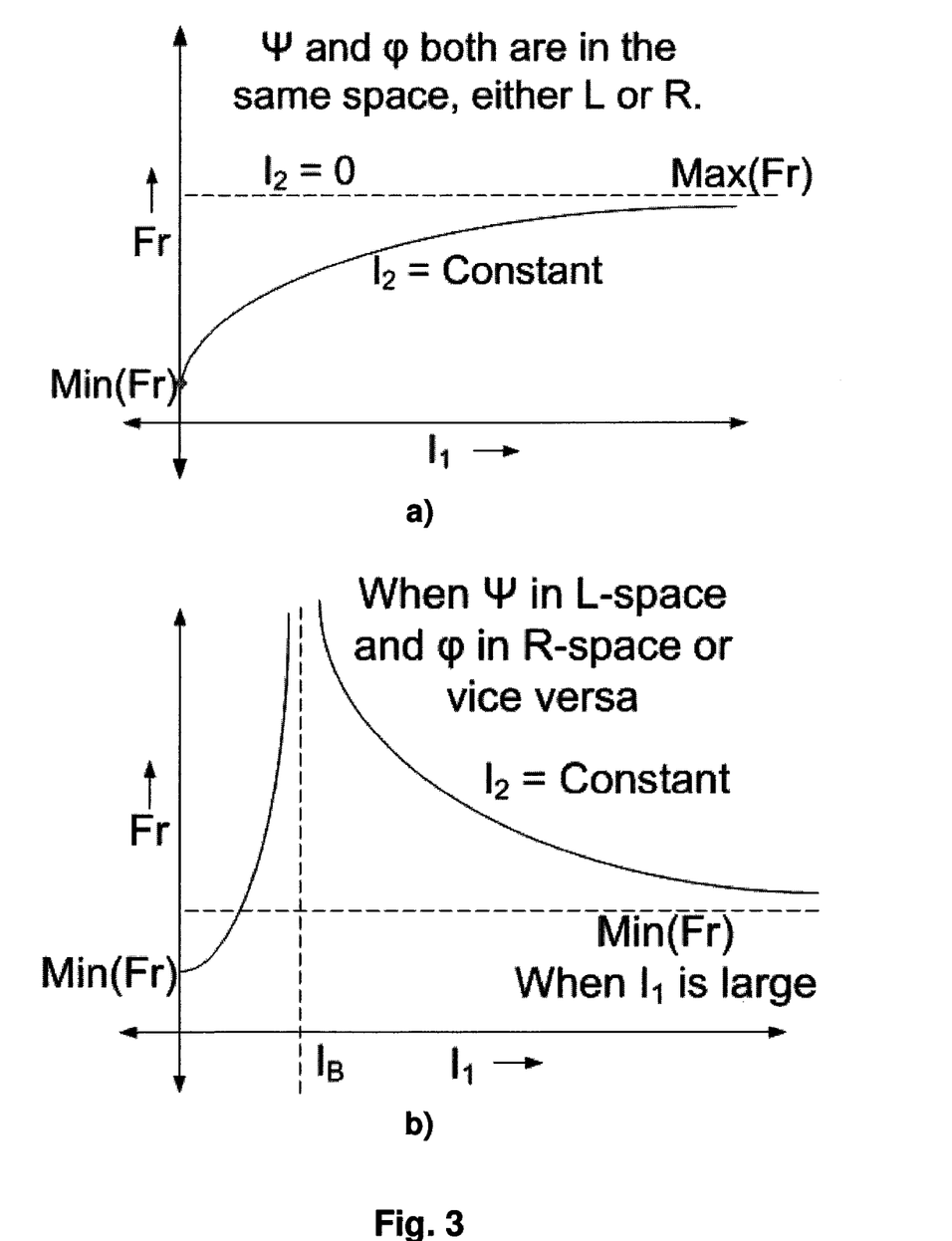
FIG. 3 provides x-y plots illustrating the characteristics of Fr curves.
Figure 4:
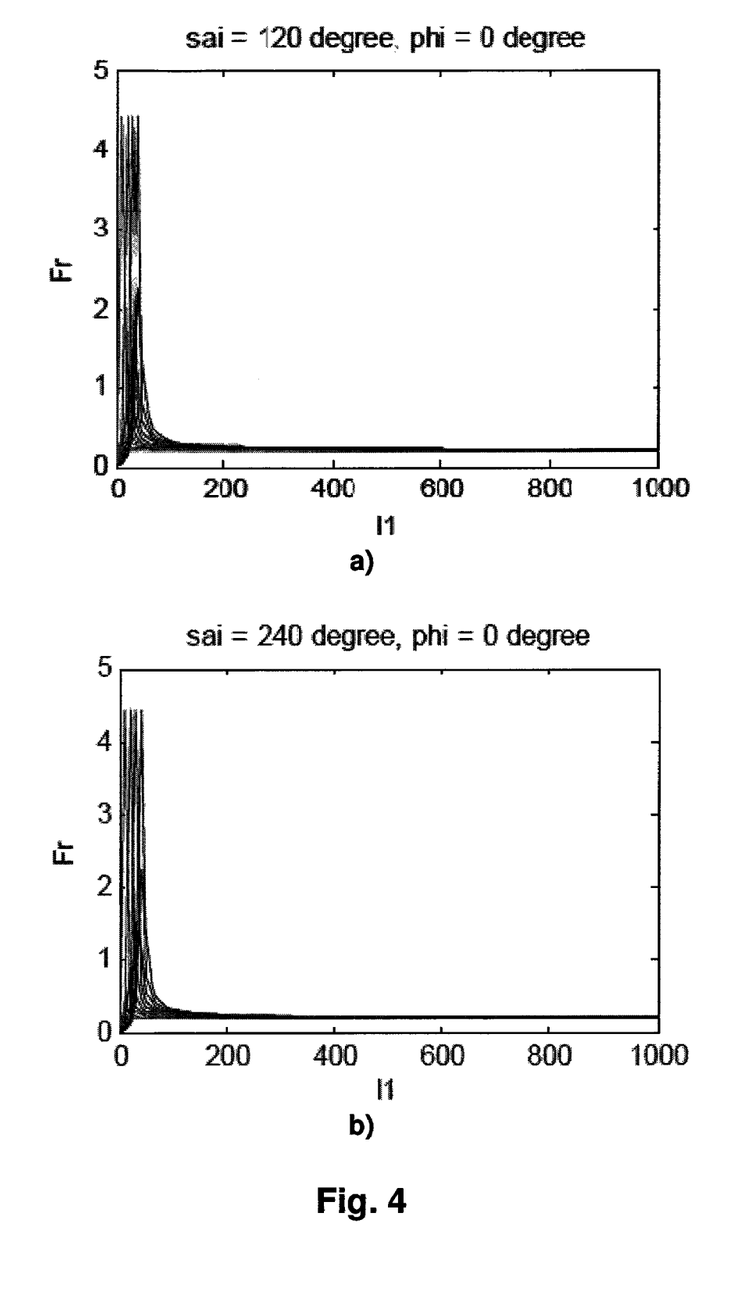
FIG. 4 provides x-y plots of Fr versus primary current for various primary current values measured in a device in accordance with the present invention.

FIG. 3 provides x-y plots illustrating the characteristics of Fr curves. If the $1^{st}$ and the $4^{th}$ quadrants of the x-y plane together are defined as the R-space, while the $2^{nd}$ and $3^{rd}$ quadrants are together defined as the L-space, then, when φ and ψ are in the same space, R or L, the Fr characteristic curve shown in FIG. 3(a) is obtained, i.e. polynomially increasing concave curves. However, when φ is in R-space and ψ is in L-space or vice versa, then the Fr characteristic curves as shown in the FIG. 3(b) are obtained. These two characteristic Fr curves have been validated using various cases and the results appear in FIG. 4, which provides x-y plots of Fr versus primary current for various primary current values measured in a device in accordance with the present invention. The characteristic nature of the curves allows Fr to be used as an indicator of the correlation between ψ, the spatial angle, and φ, the electrical phase angle.

Using the correlation indicator, Fr, d and D can be estimated in the following manner: When φ and ψ are in the same space L or R, (a) When $I_2=0$, $$\max(Fr) = \frac{P}{R} = \frac{x}{2d+x} \quad (16)$$

$$d = \frac{x}{2}\left(\frac{1}{\max(Fr)} - 1\right) \quad (17)$$

(b) When $I_1=0$, $$\min(Fr) = \frac{Q(\psi \cdot \phi \cdot D)}{S(\psi \cdot \phi \cdot D)} \quad (18)$$

And when φ and ψ are in the opposite space L or R (a) When $I_2=0$ and $I_1$ is comparatively large ($I_1 > I_B$), where $I_B$ is the x-coordinate at which the curves in FIG. 3 graph (b) go asymptotic, $$d = \frac{x}{2}\left(\frac{1}{\min(Fr|I_1 > I_B)} - 1\right) \quad (19)$$

(b) When $I_1=0$, $$\min(Fr) = \frac{Q(\psi \cdot \phi \cdot D)}{S(\psi \cdot \phi \cdot D)} \quad (20)$$

Figure 5:
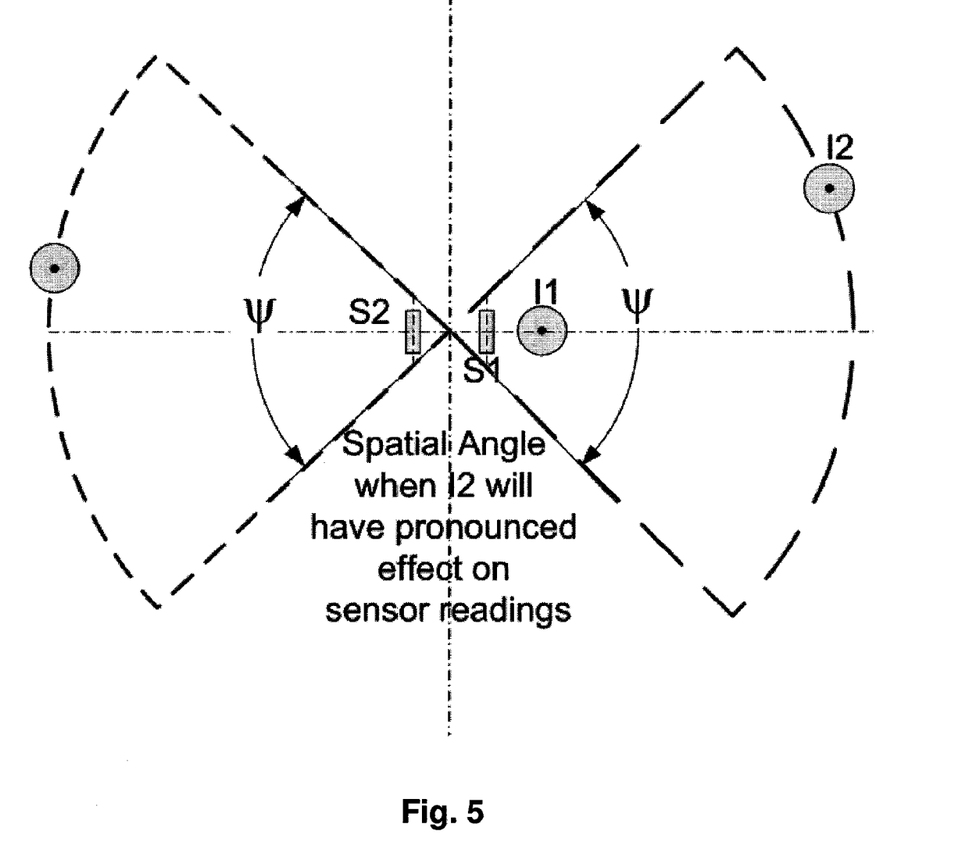
FIG. 5 provides an illustration of spatial angles for secondary currents that can have a pronounced effect on sensor readings.

It can be observed that, in the most general case, it is impossible to decouple φ and ψ; thus, it is very difficult to estimate D. The effect of the second current $I_2$ on the measurements of the first and second magnetic induction values is more pronounced when the second current-carrying utility asset 120 has a spatial angle in the range as shown in FIG. 5. When the far conductor 120 is perpendicular to the sensor cores, i.e. when the spatial angle is close to 90 degrees (or 270 degrees), the effect of the far field is negligible. This has been proven experimentally and is evident from Equations (7) and (8) for the induced SCC. Therefore, when the spatial angle is near perpendicular, an incorrect estimate of D and ψ would not introduce large errors in the current measurement. Therefore, for the estimation of D it is valid to assume that ψ is near zero (or 180 degrees). This gives a simple estimate for D, $$D = \frac{x}{2\min(Fr)} \quad (21)$$

Even with this knowledge, estimating the current in the primary conductor 110 is not straightforward. This is because the sensor does not have any information on its relative position with respect to the far-off conductor and phase angle between the currents in the two conductors. However, it can be noted that the energy harvester, which provides power to the sensor, can also act as a sensor and provide a sanity check. The sensor would calculate two different values of d, one for the case when φ and ψ are in the same space (L or R), and one when they are in different spaces (L and R). The energy harvester can then be used to do a sanity check to predict whether φ and ψ are in the same space or in a different space. In this way, the sensor would itself be able to identify which calculated value of current is accurate and would reject the erroneous value.

As long as the distance and orientation of the energy harvester with respect to $S_1$ and $S_2$ is known, the energy harvester can be positioned arbitrarily. Assume, without any loss of generality, that the energy harvester is between the two sensors. The SCC produced by the energy harvester is given by $$I_{EH} = \frac{\alpha I_1}{d + \frac{x}{2}} + \frac{\alpha I_2}{D}\cos\psi \quad (22)$$

as an approximation, if it is considered that D is very large with respect to d and x. Mathematical manipulations lead to the following:

$$d_{sanity} = \frac{x(I_d - I_{deh})}{(2I_{deh} - I_d)} \quad (23)$$

where $I_{deh}=I_{S1}-I_{EH}$, $d_{sanity}$ in Equation (23) is an approximation for d in Equation (22), $I_{SC1}$ follows Equation (7), and $I_d$ is the difference of Equations (7) minus (8). When calculating $I_{SC1}$ and $I_d$, it is assumed that $D_1 \approx D$, $D_2 \approx D$, $\Psi_1 \approx \Psi$, and $\Psi_2 \approx \Psi$.

The value of d obtained above will not be very accurate, but it can be used as a sanity check against which the estimated d from the two calculations can be compared. Finally, using the updated values of d and D in the equations for $I_d$ and $I_c$, the values of $I_1$ can be extracted as follows:

$$\begin{bmatrix} I_d \\ I_c \end{bmatrix} = \begin{bmatrix} P & Q \\ R & S \end{bmatrix} \begin{bmatrix} I_1 \\ I_2 \end{bmatrix} \quad (24)$$

This gives $$I_1 = \frac{SI_d - QI_c}{PS - QR} \quad (25)$$

Figure 6:
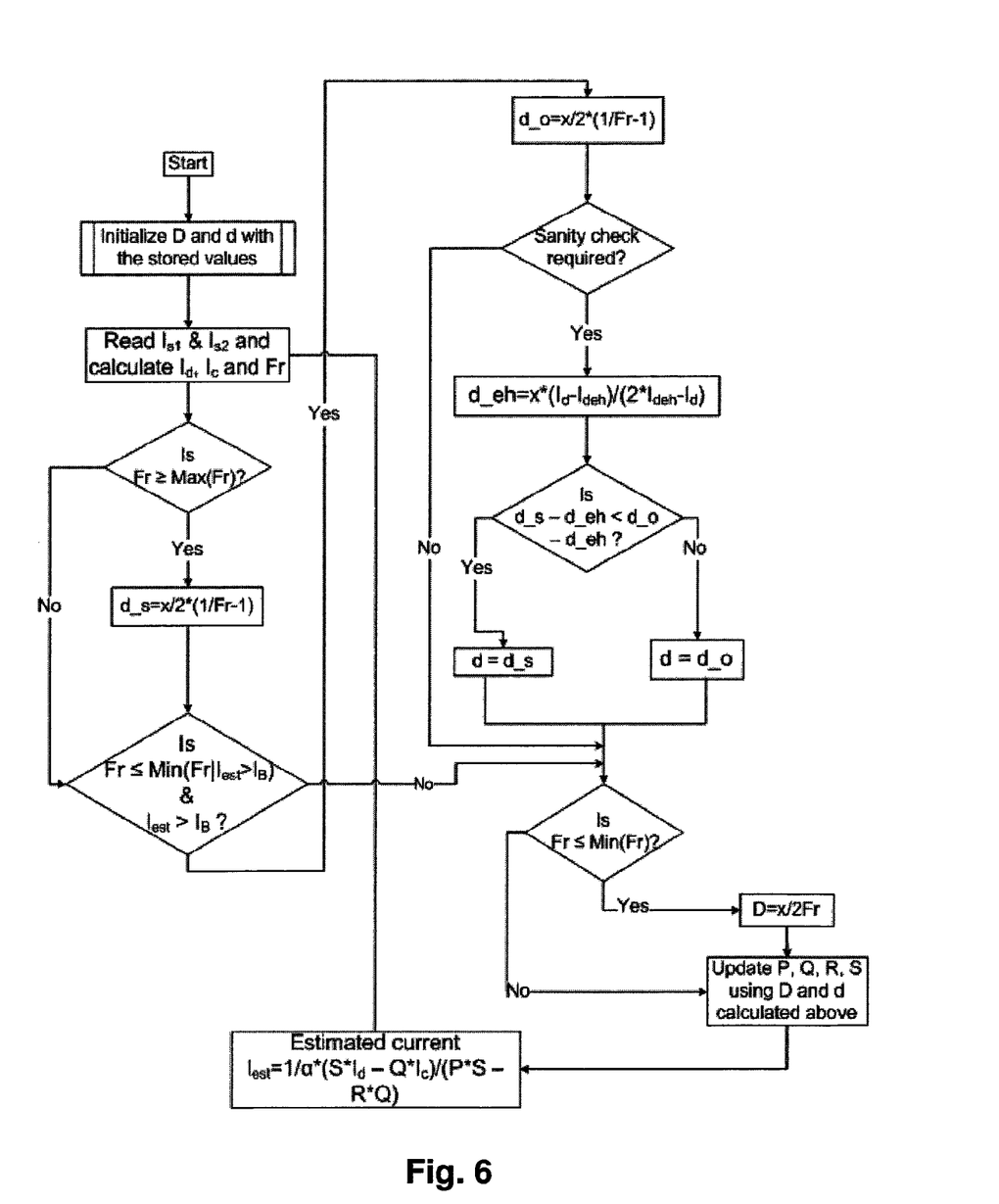
FIG. 6 provides a flowchart illustrating an exemplary method for determining current flow through a current-carrying utility asset in an exemplary embodiment of the invention.

In the above equations, P, Q, R, and S are all dependent on the geometry, which is unknown and therefore $I_1$ and $I_2$ calculated from above would be estimated values and not the true values. The values of P, Q, R, and S would improve over time due to an improvement in the estimates of d and D. Consequently, this would result in improvement in estimation of $I_1$ as well. FIG. 6 provides a flowchart illustrating an exemplary method for determining current flow through a current-carrying utility asset in an exemplary embodiment of the invention.

Figure 7:
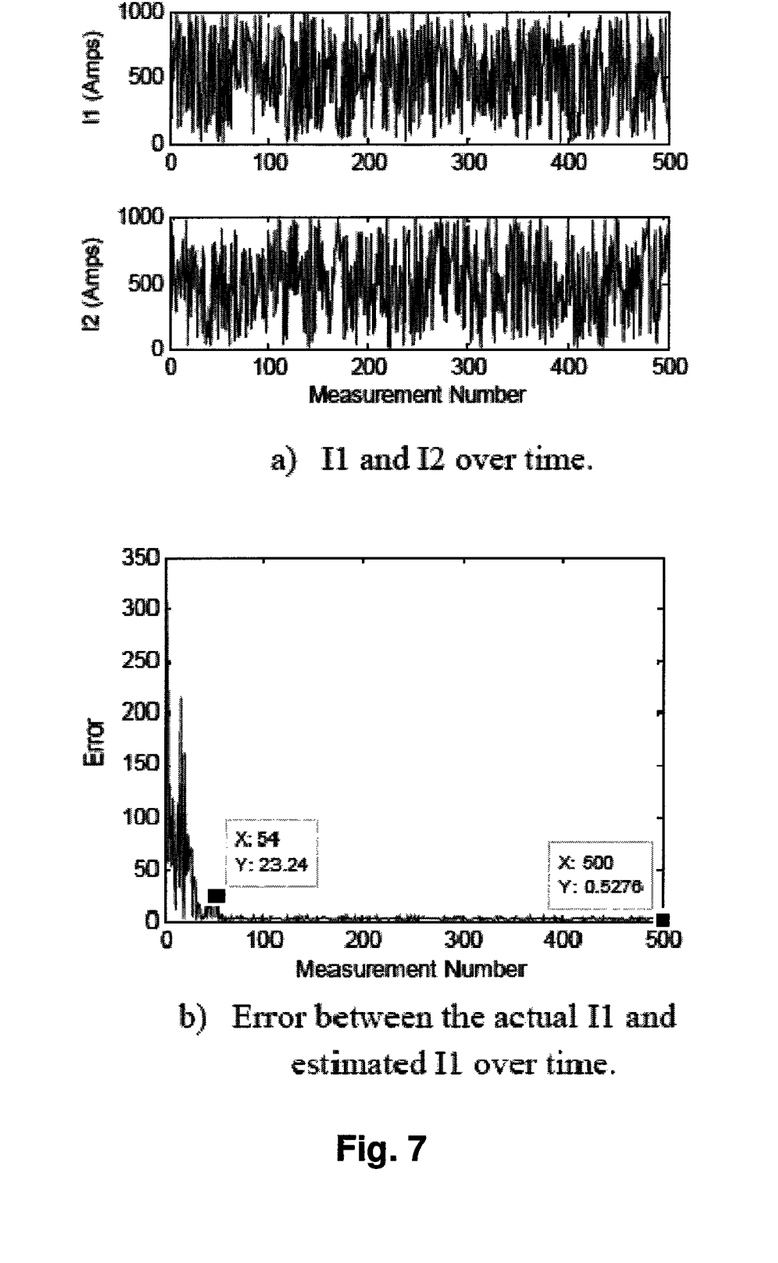
FIGS. 7 through 9 provide simulated results of values for $I_1$ and $I_2$ over time versus an error component in a measurement of $I_1$ over time in an exemplary embodiment of the invention.
Figure 8:
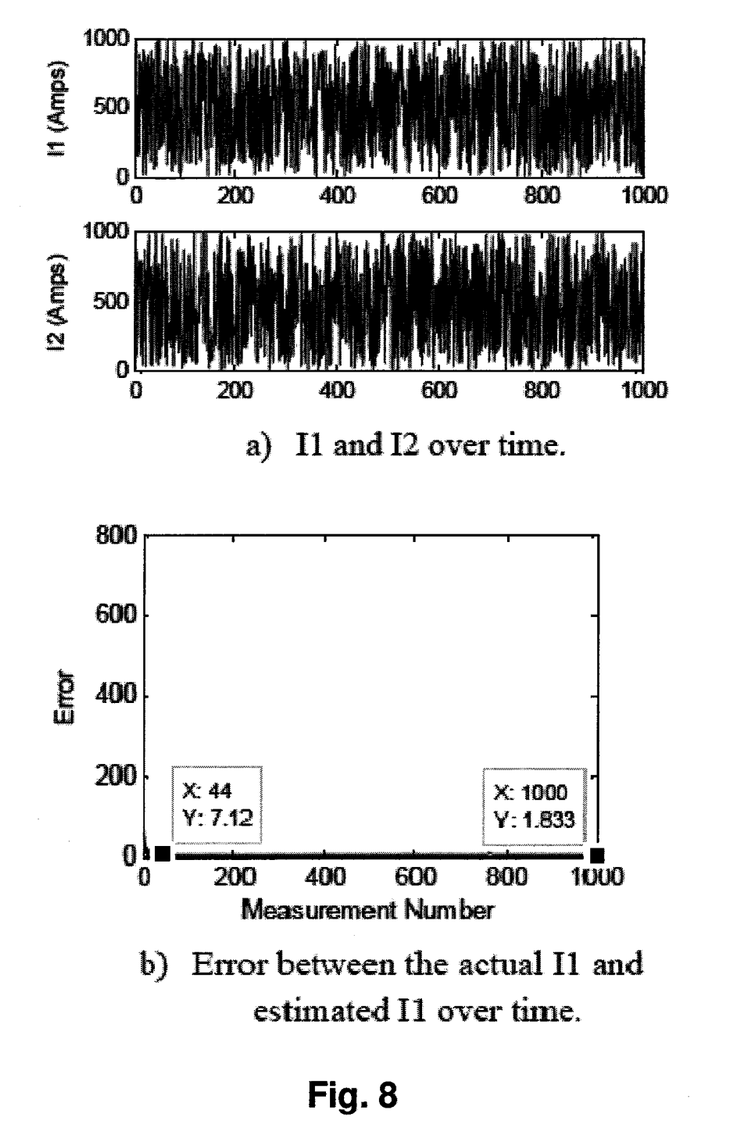
Figure 9:
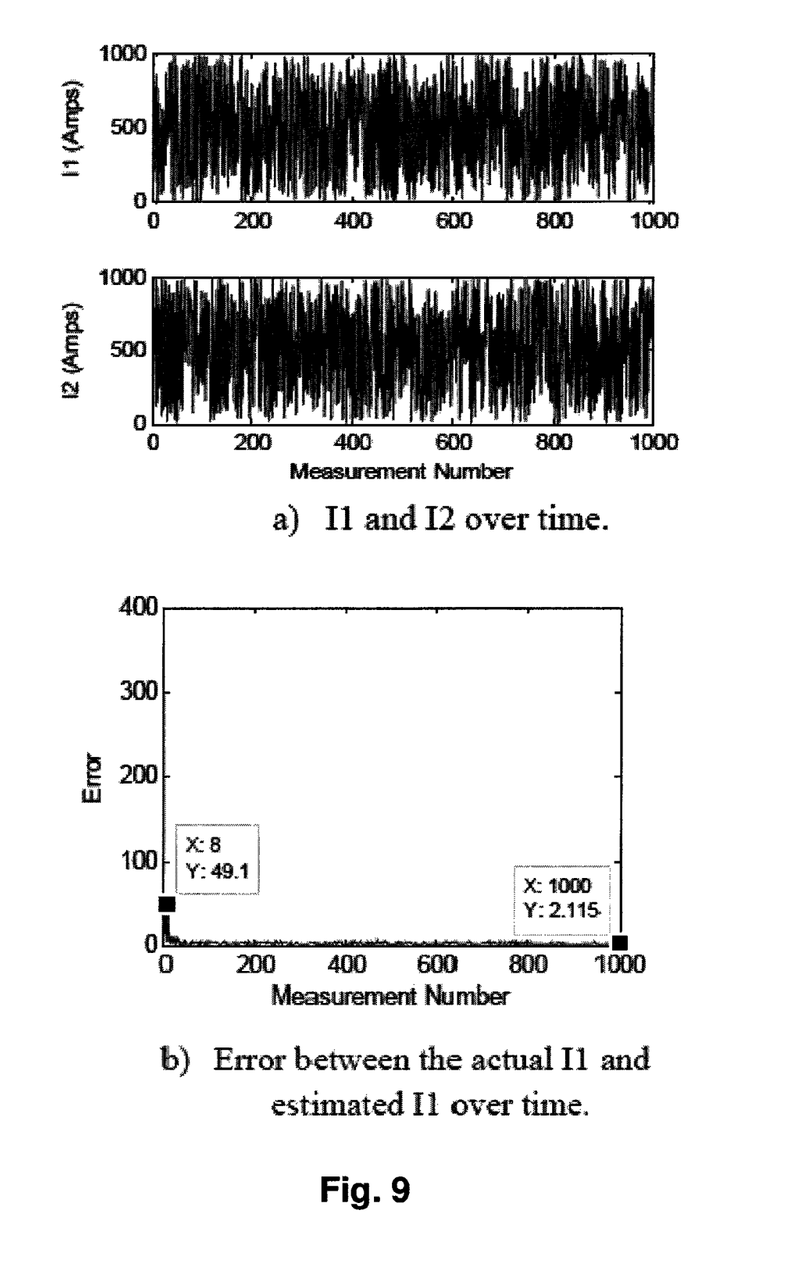

FIGS. 7 through 9 provide simulated results of values for $I_1$ and $I_2$ over time versus an error component in a measurement of $I_1$ over time in an exemplary embodiment of the invention. The simulations consider two conductors near each other that are separated in space. Both carry different phasor currents, i.e. the currents have different root mean square (RMS) values and electrical phase angles. The graphs show the actual values of $I_1$ and $I_2$ as measured over time versus the error component in the measurement of $I_1$ over time. In a realistic scenario, the RMS current would keep changing over time. The invention uses these changes over time to eliminate the effect of the far field. It can be observed that in all of the cases in FIGS. 7 through 9 irrespective of the position of the far-off conductor with respect to the nearby conductor and the phase angle between the two currents, the error goes down to near zero values over time. Hence, this method gives a very robust technique of measuring current. Moreover, the method that has been proposed is simple to implement on any low power microcontroller that has enough memory to store some historical data.

Figure 10:
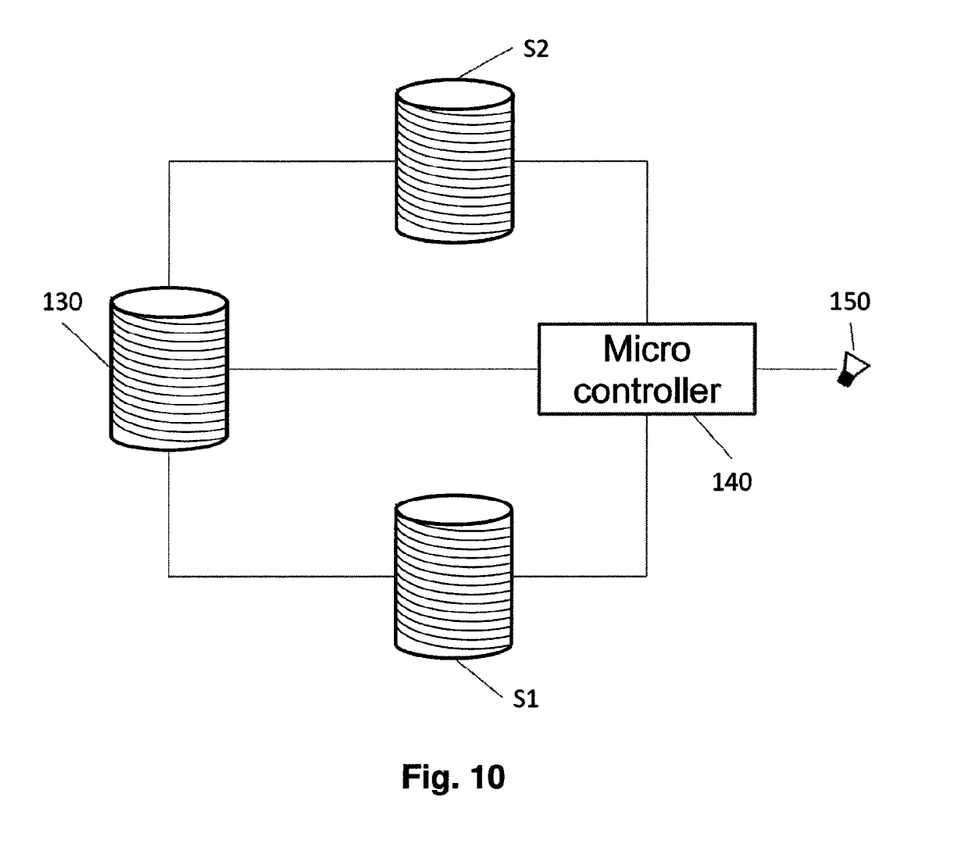
FIG. 10 provides an illustration of a system for determining current flow through a conductor in accordance with an exemplary embodiment of the invention.

FIG. 10 provides an illustration of a system for determining current flow through a conductor in accordance with an exemplary embodiment of the present invention. An energy harvester 130 can power sensor electronics, signal conditioning circuits and a microcontroller 140. The microcontroller 140 can receive measured magnetic induction values from the sensor cores $S_1$ and $S_2$ and from the energy harvester 130. The microcontroller can provide a processor and memory capable of executing a current calculation module. The current calculation module can be configured to determine a value for the current $I_1$ in the primary sensor 110. After determining a value for the current $I_1$ in the primary sensor 110, the microcontroller 140 can transmit the value through a transceiver 150 to a remote receiver where the data can be collected and monitored. The transceiver 150 can be configured to work with any of a variety of wireless communication protocols including that of the ZigBee network.

The invention is not limited to situations where there is only one far-off conductor, but can be easily extended and used for a more general case when there are many conductors distributed in space and carrying different magnitudes of current at differing electrical phase angles. All of these conductors can be represented as a single lumped conductor carrying a superimposed current $I_2'$ at an equivalent phase angle φ', placed at an effective distance D' and spatial angle ψ' from the sensor. Whenever, the current in a particular conductor changes, the position and phasor current of the effective lumped conductor also changes. The energy harvester 130 can be used as a sanity check in updating the quadrant information of this lumped effective far conductor in the sensor. Using this information, the sensor, over time, is able to accurately measure the current in the nearby conductor.

The proposed current sensing technique, therefore, allows the sensor to discriminate near magnetic fields from far fields, self-calibrate, and provide accurate current measurement values. This technique will transform an open core current sensor into a smart sensor that will not require expensive field calibration. Moreover, it would allow a current sensor to be very small and adaptable to multiple utility assets. The proposed technique is very robust and promises to be a transformational change in the way electric current is measured.

What is claimed is:
1. A system for determining current flowing through a nearby current-carrying utility asset in the vicinity of other current-carrying utility assets comprising:
   a first sensor, located at a first location near a targeted current-carrying utility asset, for measuring a first magnetic induction value having a first error component;
   a second sensor, located at a second location near the targeted current-carrying utility asset, for measuring a second magnetic induction value having a second error component, the first location being a known distance from the second location;
   a microcontroller having a processor and a memory storing instructions that, when executed by the processor, cause the processor to:
      determine a correlation between a spatial angle and an electrical phase angle, the spatial angle being between a first line connecting the first sensor and the second sensor and a second line originating at a midpoint between the first sensor and the second sensor and terminating at the second current-carrying utility asset, and the electrical phase angle being between the targeted current-carrying utility asset and a second current-carrying utility asset, the second current-carrying utility asset contributing the first error component and the second error component;
      using the correlation between the spatial angle and the electrical phase angle, calculate estimated error values for the first error component and the second error component; and
      using the first magnetic induction value, the second magnetic induction value, the known distance, and the estimated error values, calculate an estimated current flowing through the targeted current carrying utility asset.

2. The system of claim 1, wherein the first sensor and the second sensor are open core current sensors, and wherein measuring the first magnetic induction value and the second magnetic induction value further comprises measuring a first short circuit current through the first open core current sensor and a second short circuit current through the second open core current sensor.

3. The system of claim 1, wherein the first sensor and the second sensor are open core current sensors, and wherein measuring the first magnetic induction value and the second magnetic induction value further comprises measuring a first open circuit voltage through the first open core current sensor and a second open circuit voltage through the second open core current sensor.

4. The system of claim 1, the memory further storing instructions that, when executed by the processor, cause the processor to wirelessly transmit a value of the estimated current flowing through the targeted current-carrying utility asset.

5. The system of claim 1, wherein the known distance is a first known distance, and the memory further storing instructions that, when executed by the processor, cause the processor to measure, at a third sensor located at a third location near the targeted current-carrying utility asset, a third magnetic induction value, the third location being a second and third known distance from the first location and the second location, respectively.

6. The system of claim 1, wherein determining the correlation between the spatial angle and the electrical phase angle further comprises deriving a correlation indicator.

7. The system of claim 6, wherein deriving the correlation indicator further comprises obtaining an absolute value of a ratio of a difference of the first magnetic induction value and the second magnetic induction value and a sum of the first magnetic induction value and the second magnetic induction value.

8. The system of claim 6, the memory further storing instructions that, when executed by the processor, cause the processor to store at least one historical value, the at least one historical value associated with at least one of the first magnetic induction value, the second magnetic induction value, the known distance, the estimated error values and the correlation indicator.

9. The system of claim 8, wherein calculating the estimated error values further comprises using the at least one historical value.

10. A system for determining current flow through a nearby conductor in the vicinity of other current-carrying utility assets comprising:

a first open core current sensor for measuring a first magnetic induction value induced in the first open core current sensor by a targeted current-carrying utility asset and a second current-carrying utility asset, wherein the targeted current-carrying utility asset is a first unknown distance from the first open core current sensor;

a second open core current sensor for measuring a second magnetic induction value induced in the second open core current sensor by the targeted current-carrying utility asset and the second current-carrying utility asset, wherein the second open core current sensor is located a known distance from the first open core current sensor, and wherein the targeted current-carrying utility asset is a second unknown distance from the second open core current sensor, and further wherein the targeted current-carrying utility asset is located closer to the first and second open core current sensors than the second current-carrying utility asset; and a microcontroller having a processor and a memory enabled to execute a current calculating module, the current calculating module enabled to estimate, without knowing the first unknown distance and the second unknown distance, a first current flowing through the targeted current-carrying utility asset based at least in part on using the first and second magnetic induction values and the known distance.

11. The system of claim 10, wherein the first and second open core current sensors are oriented on a common axis with the targeted current-carrying utility asset.

12. The system of claim 10, further comprising a wireless radio for transmitting estimations of the first current.

13. The system of claim 10, further comprising an energy harvester for providing power.

14. The system of claim 13, wherein estimating a first current further comprises using a third magnetic induction value measured in the energy harvester.

15. The system of claim 1, wherein the targeted current-carrying utility asset is located at a first unknown distance from the first location and located at a second unknown distance from the second location.

* * * * *